(12) United States Patent
Luh

(10) Patent No.: US 7,202,762 B2
(45) Date of Patent: Apr. 10, 2007

(54) Q ENHANCEMENT CIRCUIT AND METHOD

(75) Inventor: Louis Luh, San Gabriel, CA (US)

(73) Assignee: Raytheon Company, Waltham, MA (US)

( * ) Notice: Subject to any disclaimer, the term of this patent is extended or adjusted under 35 U.S.C. 154(b) by 23 days.

(21) Appl. No.: 10/864,158

(22) Filed: Jun. 9, 2004

(65) Prior Publication Data

US 2005/0275490 A1    Dec. 15, 2005

(51) Int. Cl.
*H03H 11/00* (2006.01)
(52) U.S. Cl. .................. 333/217; 333/213; 333/216
(58) Field of Classification Search .............. 333/217
See application file for complete search history.

(56) References Cited

U.S. PATENT DOCUMENTS

| | | | |
|---|---|---|---|
| 5,343,172 A | | 8/1994 | Utsu |
| 5,892,425 A | * | 4/1999 | Kuhn et al. ................. 336/200 |
| 6,469,586 B1 | * | 10/2002 | Rogers et al. ........... 331/117 R |
| 6,621,331 B2 | * | 9/2003 | Pobanz et al. ............... 327/568 |
| 6,650,163 B1 | * | 11/2003 | Burns et al. ................. 327/295 |
| 6,680,655 B2 | * | 1/2004 | Rogers ....................... 331/109 |
| 6,681,103 B1 | * | 1/2004 | Rogers et al. ............... 455/302 |
| 6,778,023 B2 | * | 8/2004 | Christensen .................. 331/16 |
| 6,798,326 B2 | * | 9/2004 | Iida ............................ 336/200 |
| 6,970,048 B1 | * | 11/2005 | Devnath et al. .............. 331/46 |
| 2004/0066244 A1 | * | 4/2004 | Takinami et al. ....... 331/117 R |
| 2005/0156681 A1 | * | 7/2005 | Takinami et al. ....... 331/117 R |
| 2005/0264371 A1 | * | 12/2005 | Lee et al. ............... 331/177 V |

FOREIGN PATENT DOCUMENTS

| | | |
|---|---|---|
| EP | 1 282 227 A2 | 2/2003 |
| JP | 11-330851 | * 11/1999 |

* cited by examiner

*Primary Examiner*—Robert Pascal
*Assistant Examiner*—Kimberly E Glenn
(74) *Attorney, Agent, or Firm*—Leonard A. Alkov

(57) ABSTRACT

A Q enhancement circuit and method. In a most general embodiment, the inventive circuit is adapted for use with a component having a parasitic resistance $R_3$ and a first resistance $R_1$ disposed in series with the component and an arrangement for making the resistance a negative resistance. In the illustrative embodiment, first and second inductors constitute the components for which Q enhancement is effected. A resistance $R_1$ is disposed in series with the first inductor and is equal to the parasitic resistance $R_{L1}$ thereof. Likewise, a second resistance $R_2$ is disposed in series with the second inductor and is equal to the parasitic resistance $R_{L2}$ thereof. The Q enhancement circuit further includes a first transistor $Q_1$ and a second transistor $Q_2$.

4 Claims, 4 Drawing Sheets

Q ENHANCEMENT CIRCUIT AND METHOD

BACKGROUND OF THE INVENTION

1. Field of the Invention

The present invention relates to electrical and electronic circuits and systems. More specifically, the present invention relates to systems and methods for Q enhancement for passive inductive capacitive resonators in electrical and electronic circuits and systems.

2. Description of the Related Art

In reference to a resonant mechanical or electrical circuit or a capacitor, Q is a "quality factor." In the case of a resonant system, Q is a measure of the sharpness of the resonant peak in the frequency response of the system and is inversely proportional to the damping in the system: Q=center frequency divided by Hz bandwidth. Equalizers that contain resonant circuits are rated by their Q-value: the higher the Q, the higher and more well defined the peak in the response. In filters, the ratio of a bandpass or band-reject filter's center frequency to its bandwidth defines Q. Thus, assuming a constant center frequency, Q is inversely proportional to bandwidth, i.e., a higher Q indicates a narrower bandwidth. (See http://www.dilettantesdictionary.com/pdf/q.pdf.)

Hence, for a variety of applications such as analog to digital conversion, wireless communication circuits, narrowband amplifiers, microwave circuits and the like, it is useful to provide a system or method for Q enhancement.

In analog signal processing and communication systems, Q enhancement circuits typically use negative resistor circuits to cancel out parasitic serial resistance associated with the inductors (L) in the passive inductor-capacitor (LC) resonators. When implemented in fully differential mode, these circuits are usually connected in parallel with the capacitors of the resonator and typically the capacitor is connected between two inductors. Generally, the negative resistor circuits fail to adequately cancel the parasitic resistance of the inductors. This non-ideal cancellation causes other second order effects and can cause the circuit to resonate at other frequencies.

In addition, the use of negative resistors requires voltage-to-current converters to generate negative currents for the cancellation. This makes the negative resistor circuit more susceptible to non-linear distortion and circuit delay and degrades the performance of the LC resonator.

Hence, a need remains in the art for a system or method for enhancing the Q of a circuit. Particularly, a need remains in the art for a system or method for enhancing the Q of LC resonators used in analog signal processing and communication systems to improve the linearity and resolution thereof.

SUMMARY OF THE INVENTION

The need in the art is addressed by the Q enhancement circuit and method of the present invention. In a most general embodiment, the inventive circuit is adapted for use with a component having a parasitic resistance $R_{L1}$ and a first resistance $R_1$ disposed in series with the component and an arrangement for making the resistance a negative resistance.

In the illustrative embodiment, first and second inductors constitute the components for which Q enhancement is effected. A resistance $R_1$ is disposed in series with the first inductor and is equal to the parasitic resistance $R_{L1}$ thereof. Likewise, a second resistance $R_2$ is disposed in series with the second inductor and is equal to the parasitic resistance $R_{L2}$ thereof. In this embodiment, the Q enhancement circuit includes a first transistor $Q_1$ and a second transistor $Q_2$. The transistors may be BJT (bipolar junction transistor), MOSFETs (metal-oxide semiconductor field effect transistors), or other type of transistors.

In a BJT implementation, each of the collector terminals is connected to a respective one of the first or the second resistors $R_1$ or $R_2$ and each of the emitters are connected to a respective one of the inductors. In this case, the Q enhancement circuit includes a first unity-gain amplifier (emitter follower/voltage follower) connected between the collector terminal of the first transistor and the base terminal of the second transistor and a second unity-gain amplifier connected between the collector terminal of the second transistor and the base terminal of the first transistor.

In the alternative MOSFET implementation, each of the transistors has a source, a gate and a drain terminal. In this case, each of the drain terminals is connected to a respective one of the first or the second resistors $R_1$ or $R_2$ and the source terminals are connected to a respective one of the inductors. A first unity-gain amplifier (source follower) is connected between the drain terminal of the first transistor and the gate terminal of the second transistor and a second unity-gain amplifier connected between the drain terminal of the second transistor and the gate terminal of the first transistor.

In the best mode, each of the unity gain amplifier is a emitter/source follower to achieve optimal circuit simplicity and maximal operating bandwidth.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
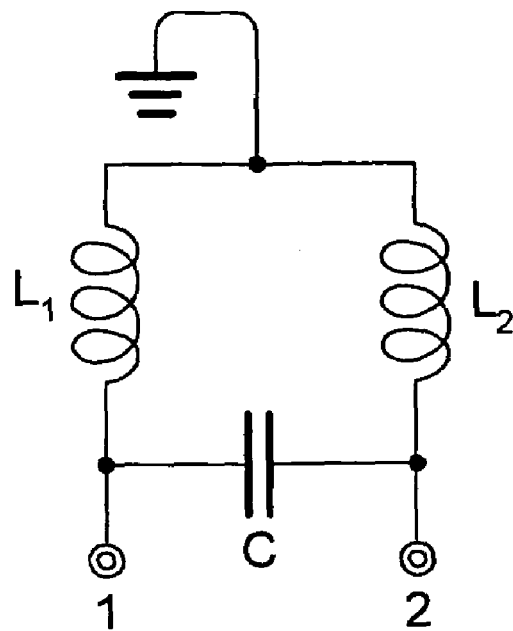
FIG. 1 is a schematic diagram showing a differential LC resonator widely used for analog signal processing in accordance with conventional teachings.
Figure 2:
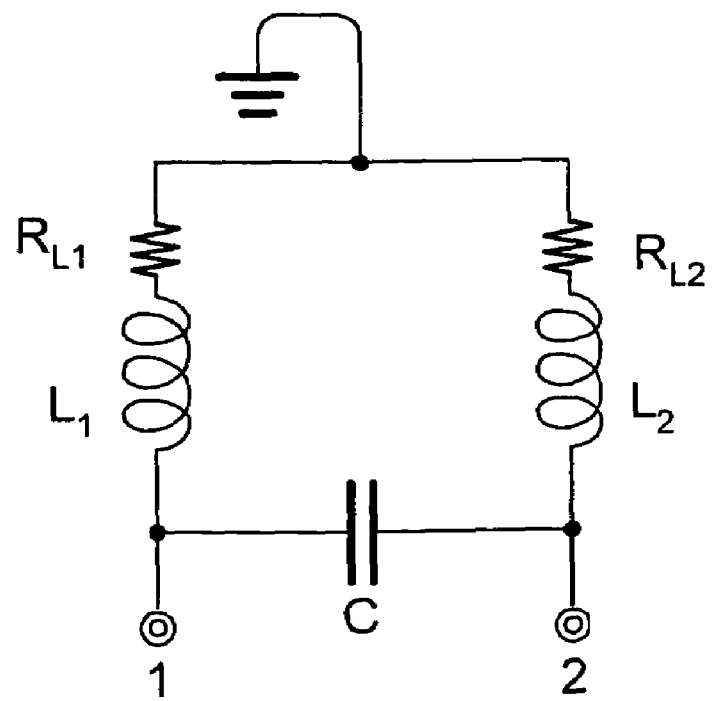
FIG. 2 is a schematic diagram of the resonator of FIG. 1 showing parasitic resistance of the inductors thereof.

FIG. 1 is a schematic diagram showing a differential LC resonator widely used for analog signal processing in accordance with conventional teachings. FIG. 2 is a schematic diagram of the resonator of FIG. 1 showing parasitic resistance of the inductors thereof. As shown in FIGS. 1 and 2, the resonator 10' includes first and second inductors $L_1$ and $L_2$ connected in parallel to a ground connection on one end and a capacitor C connected across the other ends thereof. The first and second inductors $L_1$ and $L_2$ have inherent parasitic resistance shown as, respectively, as illustrated in FIG. 2.

As is well known in the art, due to the parasitic serial resistors $R_{L1}$ and $R_{L2}$ associated with the inductors, the Q of the LC resonator is limited. One commonly used technique to increase the Q is to use a negative resistor in parallel with the capacitor. This is illustrated in FIG. 3.

Figure 3:
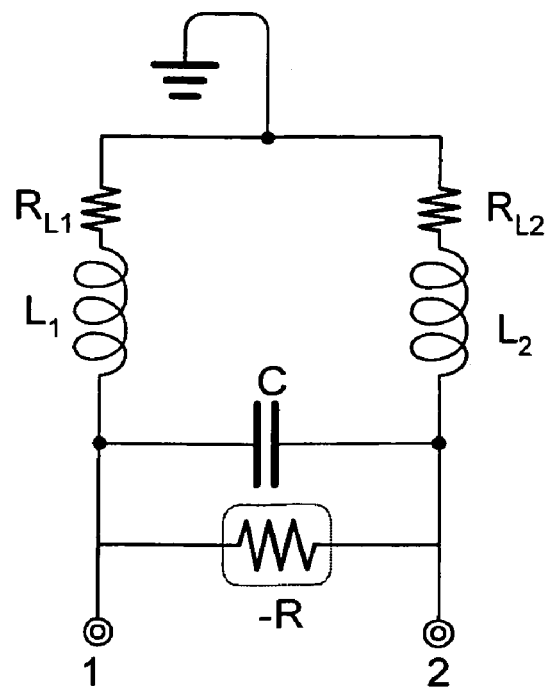
FIG. 3 shows an approach for Q enhancement of the resonator of FIG. 2 in accordance with conventional teachings.

FIG. 3 shows an approach for Q enhancement of the resonator of FIG. 2 in accordance with conventional teachings. In this resonator 20, a negative resistor R is connected in parallel with the capacitor C. Although this approach can increase the Q of the resonator, it has not been found adequate in the cancellation of the effect of the parasitic serial resistors $R_{L1}$ and $R_{L2}$ on Q. In addition, the negative resistor R makes the resonator a more complicated circuit and can cause resonance at other undesired frequencies. Hence, a need remains in the art for a system or method for enhancing the Q of a circuit.

Figure 4:
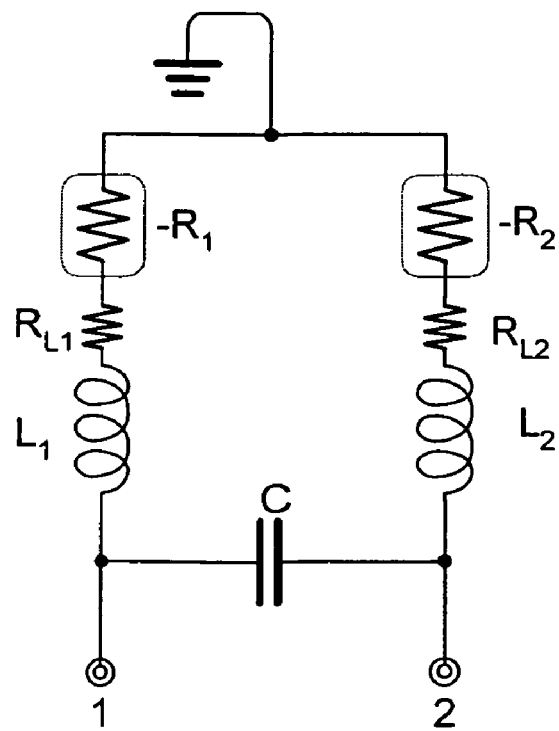
FIG. 4 is a schematic diagram of a resonator with Q enhancement implemented in accordance with an illustrative embodiment of the teachings of the present invention.

FIG. 4 is a schematic diagram of a resonator with Q enhancement implemented in accordance with an illustrative embodiment of the teachings of the present invention. The resonator 40 is similar to that of FIG. 2 with the exception that first and second negative resistors $-R_1$ and $-R_2$ are disposed in series with the first and second inductors $L_1$ and $L_2$, respectively.

Figure 5:
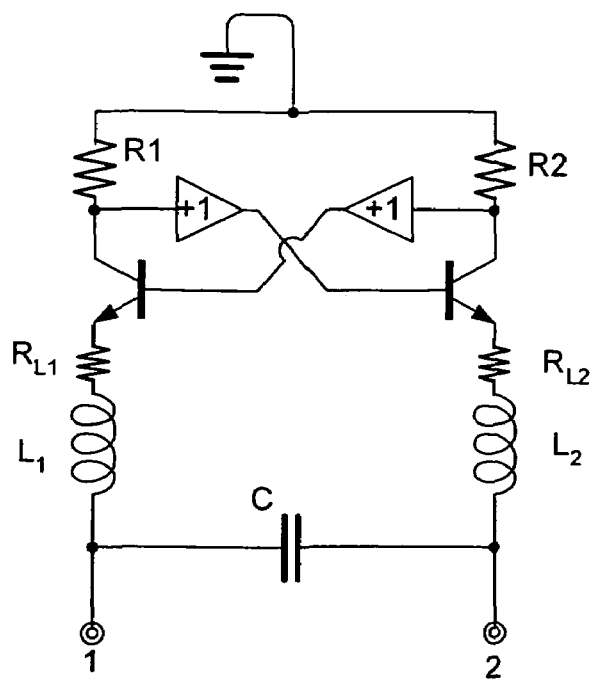
FIG. 5 is a schematic diagram of the resonator of FIG. 4 with an illustrative implementation of the negative resistors thereof.

FIG. 5 is a schematic diagram of the resonator of FIG. 4 with an illustrative implementation of the negative resistors thereof. In FIG. 5, resistors $R_1$ and $R_2$ are disposed in series with the first and second inductors. The resistors $R_1$ and $R_2$ should be equal to the parasitic serial resistors $R_{L1}$ and $R_{L2}$. First and second transistors $Q_1$ and $Q_2$ are connected in between the resistors $R_1$ and $R_2$ and the associated component, in the illustrative application, the first and second inductors $L_1$ and $L_2$, respectively. The collector of $Q_1$ is connected to $R_1$ at a node A and the collector of $Q_2$ is connected to $R_2$ at a node B. In accordance with the present teachings, a first voltage follower (unity-gain amplifier) 42 is connected between node A and the base of Q2. The second voltage follower 44 is connected between node B and the base of Q1. The first and second voltage followers 42 and 44 can be implemented by emitter followers as shown in FIG. 6 below, source followers as shown in FIG. 7 or other suitable circuit arrangement as will be appreciated by those of ordinary skill in the art.

Figure 6:
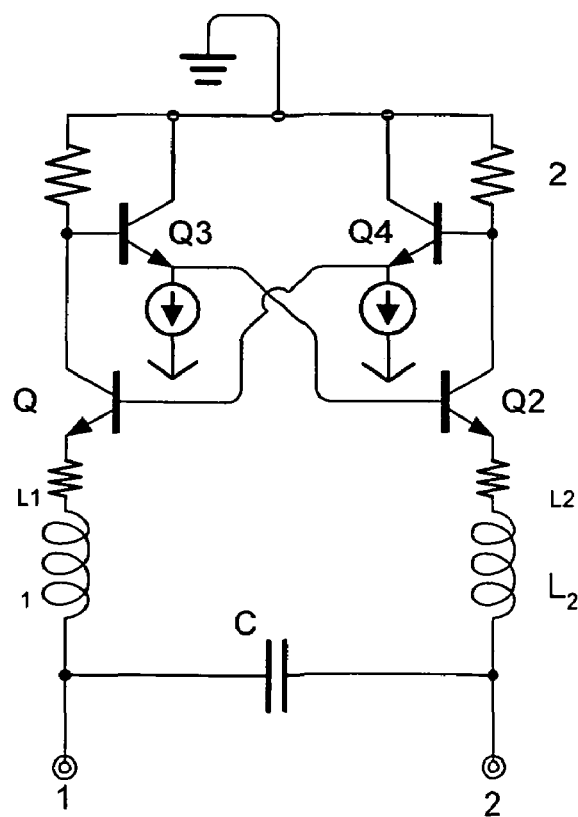
FIG. 6 is a schematic diagram of the resonator of FIG. 5 with a bipolar emitter follower implementation for the voltage followers thereof.

FIG. 6 is a schematic diagram of the resonator of FIG. 5 with a bipolar emitter follower implementation for the voltage followers thereof. In this embodiment, the first follower 42 is implemented with a third bipolar transistor $Q_3$ having its base connected to node A, its collector connected to ground and its emitter connected to a first current source 46. The second follower 44 is implemented with a fourth bipolar transistor $Q_4$ having its base connected to node B, its collector connected to ground and its emitter connected to a second current source 48. While an NPN implementation is shown, those skilled in the art will appreciate that a PNP implementation may be employed as well.

Figure 7:
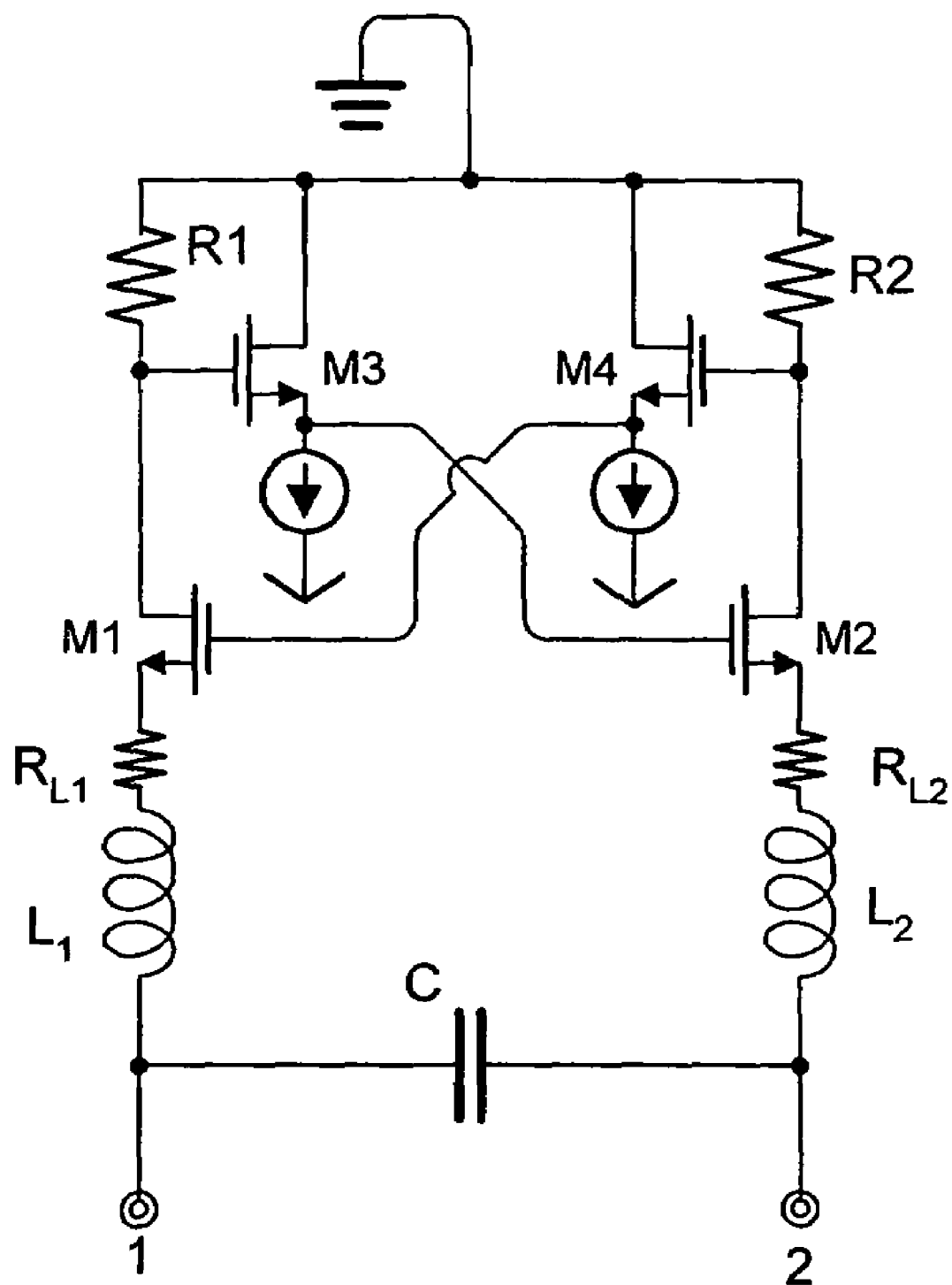
FIG. 7 is a schematic diagram of the resonator of FIG. 5 with a MOSFET source follower implementation for the voltage followers thereof.

FIG. 7 is a schematic diagram of the resonator of FIG. 5 with a MOSFET source follower implementation for the voltage followers thereof. In this embodiment 30'', n-channel MOSFETs $M_1$ and $M_2$ are used in place of the first and second transistors $Q_1$ and $Q_2$ of FIG. 6. In addition, the first follower 42 is implemented with a third MOSFET transistor $M_3$ having its gate connected to node A, its drain connected to ground and its source connected to the first current source 46. The second follower 44 is implemented with a fourth MOSFET transistor $M_4$ having its gate connected to node B, its drain connected to ground and its source connected to the second current source 48. While an n-channel implementation is shown, those skilled in the art will appreciate that a p-channel implementation may be employed as well.

The inventive enhancement circuit 40 should cancel the effect of the inherent parasitic resistance and improve the Q factor of the components with which it is used.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

What is claimed is:

1. A Q enhancement circuit for a component having a parasitic resistance RL1, said enhancement circuit comprising;
    a first resistance R1 disposed in series with said component;
    first means for making said resistance R1 disposed in series with said component a negative resistance –R1, wherein said first means for making said resistance R1 a negative resistance includes a first transistor Q1;
    a second component having a parasitic resistance RL2;
    second resistance R2 disposed in series with said second component; and
    second means for making said second resistance R2 a negative resistance –R2, wherein said second means for making said resistance includes a second transistor Q2 and each of said transistors has a collector, a base and an emitter terminal,
    wherein each of said collector terminals of said transistors Q1 and Q2 is connected to a respective one of first or second resistors R1 or R2 and said emitter terminals are connected to a respective one of said components.

2. The invention of claim 1 wherein said Q enhancement circuit includes a first amplifier connected between the collector terminal of the first transistor and the base terminal of the second transistor and a second amplifier connected between the collector terminal of said second transistor and said base terminal of said first transistor.

3. The invention of claim 2 wherein each of said amplifiers is a unity gain amplifier.

4. The invention of claim 3 wherein each of said amplifiers is an emitter follower.

* * * * *